United States Patent [19]
Bosch et al.

[11] Patent Number: 6,130,562
[45] Date of Patent: Oct. 10, 2000

[54] DIGITAL DRIVER CIRCUIT

[75] Inventors: Fridolin L. Bosch, Bethlehem; Gregory C. Salvador, Wernersville, both of Pa.

[73] Assignee: Lucent Technologies, Inc., Murray Hill, N.J.

[21] Appl. No.: 09/134,364

[22] Filed: Aug. 14, 1998

[51] Int. Cl.$^7$ .................................................. H03B 1/00
[52] U.S. Cl. .......................... 327/109; 327/333; 327/563; 372/38
[58] Field of Search ........................... 327/180, 109–111, 327/306, 333, 560–561, 563; 372/25, 26, 33, 38; 375/237, 238; 330/252, 253, 259, 260; 326/82, 83, 84

[56] References Cited

U.S. PATENT DOCUMENTS

| | | | |
|---|---|---|---|
| 4,796,266 | 1/1989 | Banwell et al. | 372/38 |
| 4,809,286 | 2/1989 | Kollanyi et al. | 372/38 |
| 5,297,157 | 3/1994 | Kaiser et al. | 372/38 |
| 5,444,728 | 8/1995 | Thompson | 372/38 |
| 5,748,657 | 5/1998 | Gaddis | 372/38 |
| 5,825,819 | 10/1998 | Cogburn | 375/257 |

OTHER PUBLICATIONS

Chen & Bosch, GaAs MESFET Laser–Driver IC for 1.7 Gbits/s Lightwave Transmitter, in Journal of Lightwave Technology, vol. 6, No. 3, Mar. 3, 1998.

Shumate et al. GaAiAs Laser Transmitter for Lightwave Transmission Systems, in The Bell Systems Technical Journal, Jul.–Aug. 1978.

*Primary Examiner*—Terry D. Cunningham
*Assistant Examiner*—Minh Nguyen
*Attorney, Agent, or Firm*—Dickstein Shapiro Morin & Oshinsky LLP

[57] ABSTRACT

A digital driver circuit with increased maximum output voltage amplitude and therefore also increased maximum current amplitude for constant power supply voltages is provided. A current sensing resistor replaces the conventional current source transistor in the output stage of the driver circuit. In addition, the output current control circuit is applied to an earlier stage of the driver. An automatic output current control scheme is created which keeps the voltage across the current sensing resistor equal to a DC reference and therefore maintains the output current or voltage amplitude by actively level shifting the DATA and DATA drive signals for the output stage to the correct level. This eliminates the necessity to incorporate a voltage safety margin and simultaneously increases the maximum available output voltage amplitude. Therefore, by utilizing the current sensing resistor and by moving the output amplitude control circuit to an earlier stage of the driver circuit, the driver circuit of the present invention provides increased output voltage and current amplitudes to drive modulated devices. In another embodiment, the automatic output amplitude control scheme is created by keeping the voltage across the current sensing resistor equal to a Mark-Bar reference signal corresponding to input data.

31 Claims, 3 Drawing Sheets

DIGITAL DRIVER CIRCUIT

BACKGROUND OF THE INVENTION

1. Field of the Invention

This invention relates generally to digital driver circuits and, in particular, to a digital driver circuit for controlling the operation of an EML (electroabsorption modulated laser) or a direct modulated laser.

2. Description of the Related Art

An important feature of the digital driver is its output capability and efficiency, that is, the maximum voltage amplitude the driver can apply across a load (in, for example, an EML) or the maximum current through the load (in, for example, a laser) for a given power supply voltage. In order to reduce the unavoidable power dissipation in a driver circuit, the power supply voltage is reduced. This is the observed long-term trend for systems with progressing miniaturization: the subcomponents move closer together and there overall power dissipation is reduced due to an ongoing power supply voltage reduction. A driver is more efficient if the output capability is constant with its reduced supply voltage.

The last power stage in a digital driver is generally an emitter-coupled current switching transistor pair fed by a current source. The adjustable current source, normally a single transistor guarantees constant amplitude output current as shown in Chen & Bosch, GaAs MESFET Laser-Driver IC for 1.7 Gbits/s Lightwave Transmitter, in Journal of Lightwave Technology, Vol. 6, No. 3, Mar. 3, 1988 and Shumate et al., GaAiAs Laser Transmitter for Lightwave Transmission Systems, in The Bell Systems Technical Journal, July–August 1978, which are hereby incorporated by reference.

With proper bias levels the transistors are never driven into saturation which results in fast switching times. Another feature of these circuits is the constant current nature generating minimum switching noise on the power bus.

FIG. 1 illustrates a conventional driver circuit 10 used to control a modulated device 50 such as a laser or EML. The circuit 10 includes three stages, an input stage 12, level shifting stage 30 and an output stage 40.

The input stage 12 contains two load resistors 14, 16, and first, second and third transistors 18, 20, 22. The first transistor 18 has its gate terminal connected to the input data signal DATA while the second transistor 20 has its gate terminal connected to the complement of the input data signal $\overline{\text{DATA}}$. The first load resistor 14 is connected between a power supply potential $V_{CC}$ and the drain terminal of the first transistor 18. The second load resistor 16 is connected between the power supply potential $V_{CC}$ and the drain terminal of the second transistor 20. The first and second transistors 18, 20 have their source terminals connected to the drain terminal of the third transistor 22. The third transistor 22 has its source terminal connected to a second potential $V_{EE}$ and its gate terminal connected to a gate voltage $V_G$ sufficient to activate the transistor 22. The power supply potential $V_{CC}$ is usually 0 volts while the second potential $V_{EE}$ is usually −5 volts.

The input stage 12 quantizes the input signals DATA, $\overline{\text{DATA}}$ and they appear shifted to a more positive potential at the load resistors 14 and 16. After this processing the signals are shifted to a more negative potential through the level shifter stage 30 to ensure the proper potential level for the final driver stage 40. The level shifting stage 30 consists of two individual level shifter circuits 32, 34. The outputs of the two level shifter circuits 32, 34 are fed into the output stage 40.

The output stage 40 includes a third load resistor 48 and fourth, fifth and sixth transistors 42, 44, 46. The fourth transistor 42 has its gate terminal connected to the level shifted input data signal while the fifth transistor 44 has its gate terminal connected to the level shifted complement of the input data signal. The third load resistor 48 is connected between the power supply potential $V_{CC}$ and the drain terminal of the fourth transistor 42. The fourth and fifth transistors 42, 44 have their source terminals connected to the drain terminal of the sixth transistor 46. The sixth transistor 46 has its source terminal connected to the second potential $V_{EE}$ and its gate terminal connected to a control voltage $V_{C1}$ which is sufficient to activate the transistor 46. In this configuration, the fourth and fifth transistors 42, 44 form a differential amplifier circuit 45 whose current is controlled by the sixth transistor 46 (acting as a current source transistor). The output of the differential amplifier circuit 45 drives the modulated device 50. That is, the differential amplifier circuit 45 switches the constant source current of the device 46 according to the input signals DATA, $\overline{\text{DATA}}$ and creates an output with constant current and constant voltage amplitudes at device 50.

Although the conventional driver circuit 10 works well in many applications, it has an insufficient drive capability for some applications with a given supply voltage.

In order for the circuit 10 to work safely, the common emitter potential of switching devices 42 and 44 must be sufficiently positive relative to VEE so that the current source transistor 46 is never driven into saturation. One also has to take into consideration variations in power supply voltages VCC-VEE and voltage drop differences on level shifters 32 and 34 and gate-emitter voltage differences on devices 42 and 44 from lot to lot and with temperature. As a result the gate voltages of devices 42 and 44 must be overdesigned to set an ample safety margin relative to VEE with the result that the maximum output drive voltage amplitude is about two volts less than the supply voltage VCC-VEE. This voltage amplitude limit is also limiting the maximum current, which can be drawn through a laser with a matching resistor in series.

There is a need and desire for increased output current and voltage amplitudes in a digital driver circuit used to drive a laser or EML respectively, which has fewer problems caused by a shortage of voltage for operating transistors in the output stage.

BRIEF SUMMARY OF THE INVENTION

The present invention provides a digital driver circuit for driving a modulated device having increased output voltage and current amplitudes without increasing the power supply voltage.

The above features and advantages are achieved by providing a new control for the last stage of the driver circuit which avoids the overdesigned safety margin. A current sensing resistor replaces the conventional current source transistor in the final output stage of the driver circuit and, in addition, the current control circuit acts on an earlier stage of the driver. An automatic current output amplitude control scheme is created by keeping the voltage across the current sensing resistor equal to a DC reference by shifting the drive signal up or down as required. Therefore, by utilizing the current sensing resistor and by moving the output amplitude control circuit to an earlier stage of the driver circuit, the driver circuit of the present invention provides increased output voltage and current amplitudes. This is achieved because the previous drop on the current source transistor has been eliminated and the gate voltages of the transistors in the output stage do not require a safety margin.

In another embodiment of the present invention, the automatic output amplitude control scheme is created by keeping the voltage across the complementary resistor acting now as a current sensing resistor equal to a Mark-Bar reference signal corresponding to input data.

BRIEF DESCRIPTION OF THE DRAWINGS

The foregoing and other objects and advantages of the invention will become more apparent from the detailed description of the preferred embodiments of the invention given below with reference to the accompanying drawings in which.

DETAILED DESCRIPTION OF THE PREFERRED EMBODIMENTS

Figure 2:
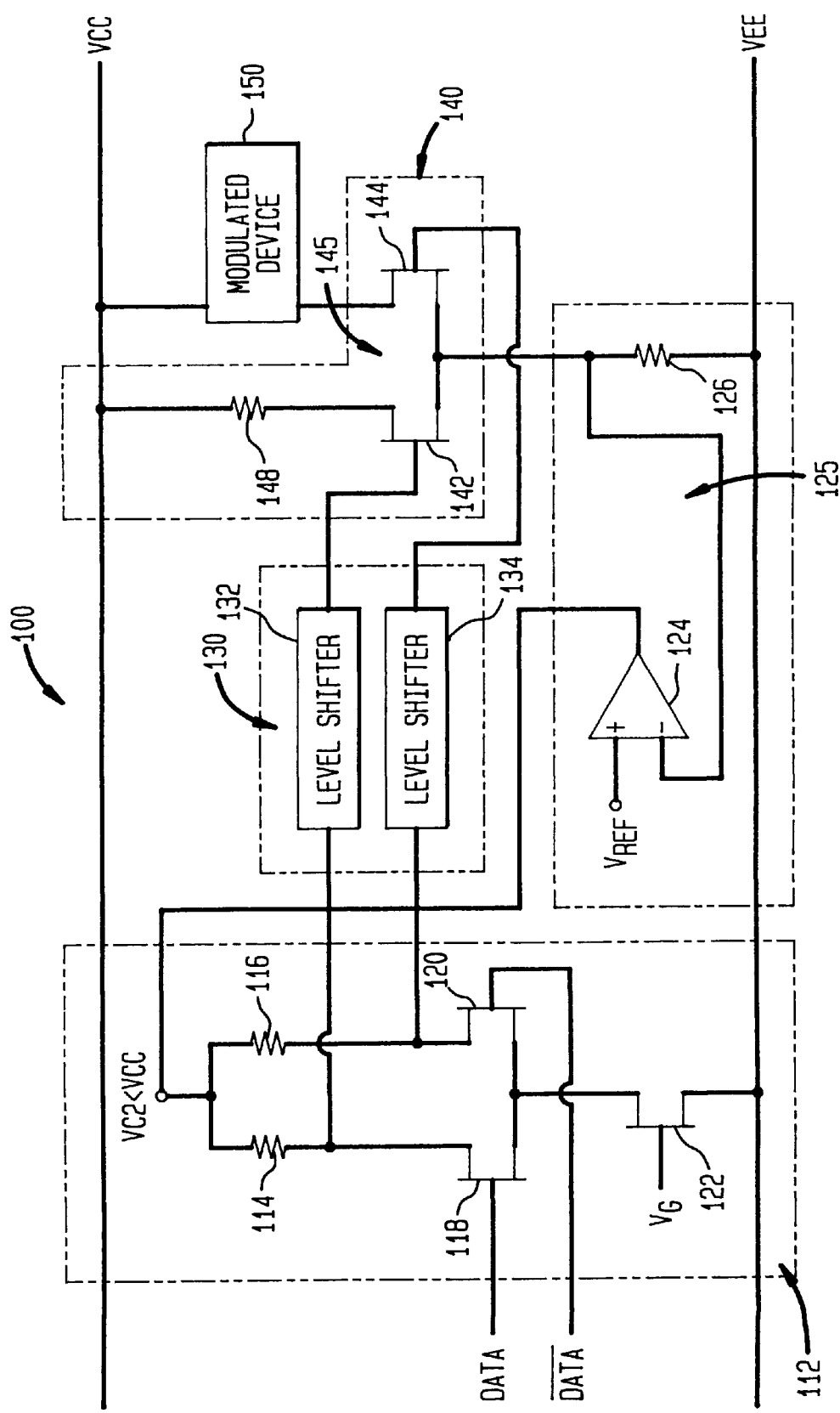
FIG. 2 is a circuit diagram of a driver circuit constructed in accordance with a first embodiment of the present invention.

FIG. 2 illustrates a driver circuit 100 constructed in accordance with a first embodiment of the present invention. The driver circuit 100 is used for driving a modulated device 150. In a preferred embodiment, the modulated device 150 is a laser or an EML with appropriate circuitry. The circuit 100 includes three stages, an input stage 112, level shifting stage 130 and an output stage 140.

Figure 1:
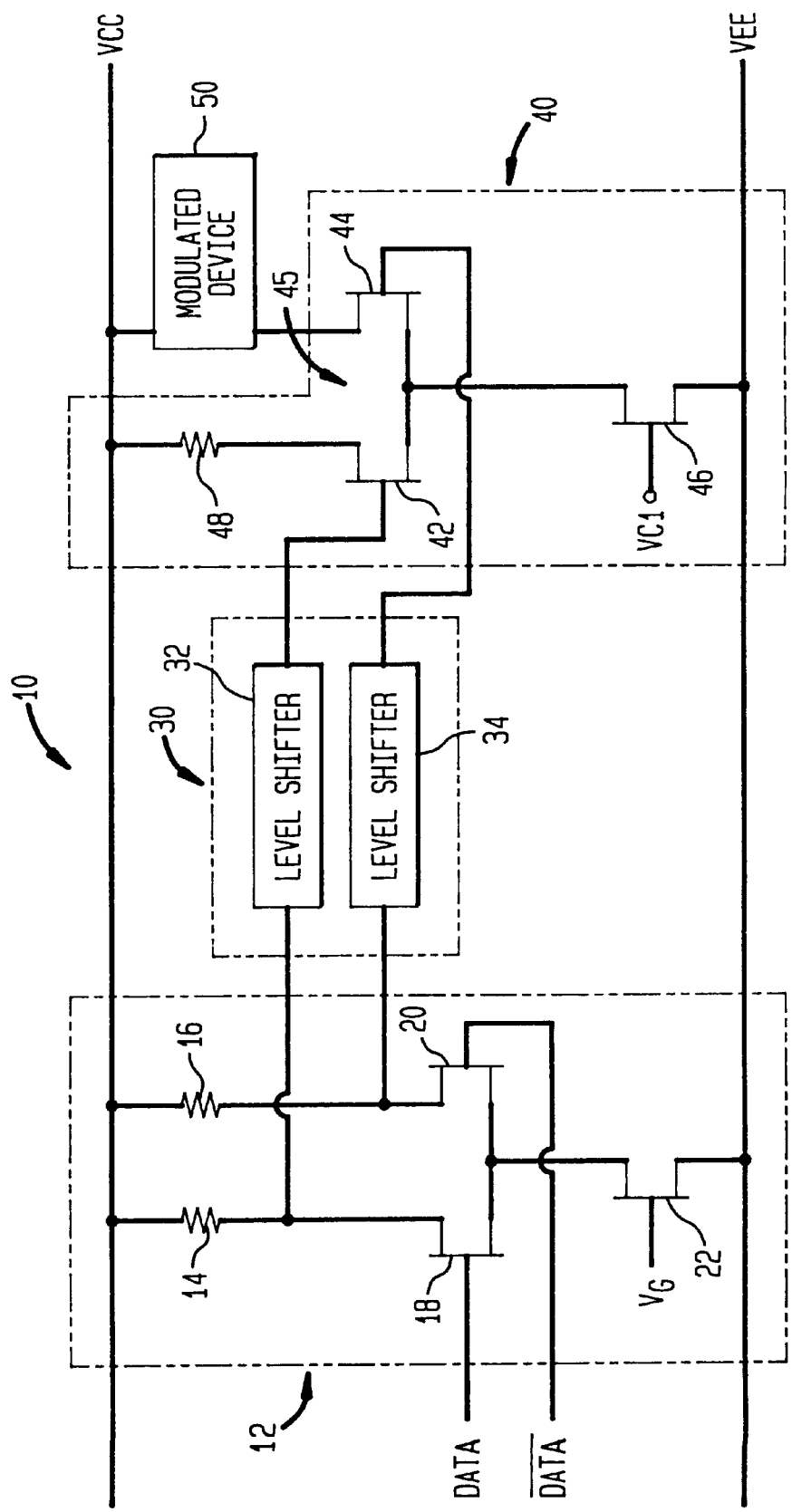
FIG. 1 is a circuit diagram of a conventional driver circuit used for driving a modulated device.

The input stage 112 contains two load resistors 114, 116, first, second and third transistors 118, 120, 122, an operational amplifier 124 having one input connected to a current sensing resistor 126 located in the output stage 140. The first transistor 118 has its gate terminal connected to the input data signal DATA while the second transistor 120 has its gate terminal connected to the complement of the input data signal $\overline{DATA}$. One input of the operational amplifier 124 is connected to a direct current (DC) reference voltage $V_{REF}$. The second input of the operational amplifier 124 is connected to a node between the current sensing resistor 126 and the transistors 142, 144 of the output stage 140. The operational amplifier 124, current sensing resistor 126 and the DC reference voltage $V_{REF}$ define an output amplitude control circuit 125 whose output is used as a control voltage $V_{C2}$ of the input stage 112. The variable voltage VC2 adds actively to the fixed level shifting provided by the level shifters 132 and 134. The automatic control of VC2 results in the correct voltage level at the gates of transistors 142 and 144. No safety margin has to be considered, therefore, no overhead voltage is unnecessarily lost. The resulting maximum output voltage amplitude is therefore approximately one volt larger than that of the circuit 10 illustrated in FIG. 1. It must be noted that the value of the DC reference voltage $V_{REF}$ is user defined and is altered depending upon the particular application the driver circuit 100 is to be used in.

The first load resistor 114 is connected between the control voltage $V_{C2}$ and the drain terminal of the first transistor 118. The second load resistor 116 is connected between the control voltage $V_{C2}$ and the drain terminal of the second transistor 120. The second load resistor 116 is also connected to the first load resistor 114. The first and second transistors 118, 120 have their source terminals connected to the drain terminal of the third transistor 122. The third transistor 122 has its source terminal connected to a second potential $V_{EE}$ and its gate terminal connected to a gate voltage $V_G$ sufficient to activate the third transistor 122. The power supply potential $V_{CC}$ is usually 0 volts while the second potential $V_{EE}$ is usually −5 volts.

The input stage 112, quantizes the input signals DATA, $\overline{DATA}$. In addition, the output amplitude control circuit 125 of the input stage 112 is used to automatically control and maintain the output voltage and current of the output stage 140. This is achieved by creating and maintaining a constant voltage across a current sensing resistor 126 within the output stage 140. The voltage across the current sensing resistor 126 is equal to and controlled by the DC reference voltage $V_{REF}$ applied to the operational amplifier 124. Since the DC reference voltage $V_{REF}$ is adjustable, the voltage across the current sensing resistor 126 is also adjustable. Accordingly, the output voltage and current of the output stage 140 can be adjusted to meet the requirements of a specific application.

Once quantized, the input signals DATA, $\overline{DATA}$ are passed through the level shifting stage 130 to ensure that the voltage levels of the quantized signals are at a proper level for the remaining circuitry of the driver circuit 100. The level shifting stage 130 contains two level shifter circuits 132, 134. The outputs of the two shifter circuits 132, 134 are fed into the output stage 140.

The output stage 140 includes the current sensing resistor 126, a third load resistor 148 and fourth and fifth transistors 142, 144. The fourth transistor 142 has its gate terminal connected to the level shifted input data signal while the fifth transistor 144 has its gate terminal connected to the level shifted complement of the input data signal. The third load resistor 148 is connected between the power supply potential $V_{CC}$ and the drain terminal of the fourth transistor 142. The fourth and fifth transistors 142, 144 have their source terminals connected to the current sensing resistor 126. In this configuration, the fourth and fifth transistors 142, 144 form a differential amplifier circuit 145 whose current is controlled by the output amplitude control circuit 125 not a current source transistor 46 as in the prior art circuit 10 (see FIG. 1). As stated above, there will be a constant voltage across the current sensing resistor 126 equivalent to the DC reference voltage $V_{REF}$. By removing the current source transistor 46 from the output stage 140 and keeping the voltage across the current sensing resistor 126 constant, there is more available voltage and current that can be used to drive the modulated device 150. The output of the differential amplifier circuit 145 drives the modulated device 150. That is, the differential amplifier circuit 145 switches the current through resistor 126 which is automatically kept constant according to the input signals DATA, $\overline{DATA}$ and creates an output suitable to drive the modulated device. As stated earlier, by utilizing the current sensing resistor 126 and by applying the current control circuit 125 to an earlier stage of the driver circuit 100, the driver circuit 100 of the present invention provides increased output voltage and current amplitudes to modulate device 150.

Figure 3:
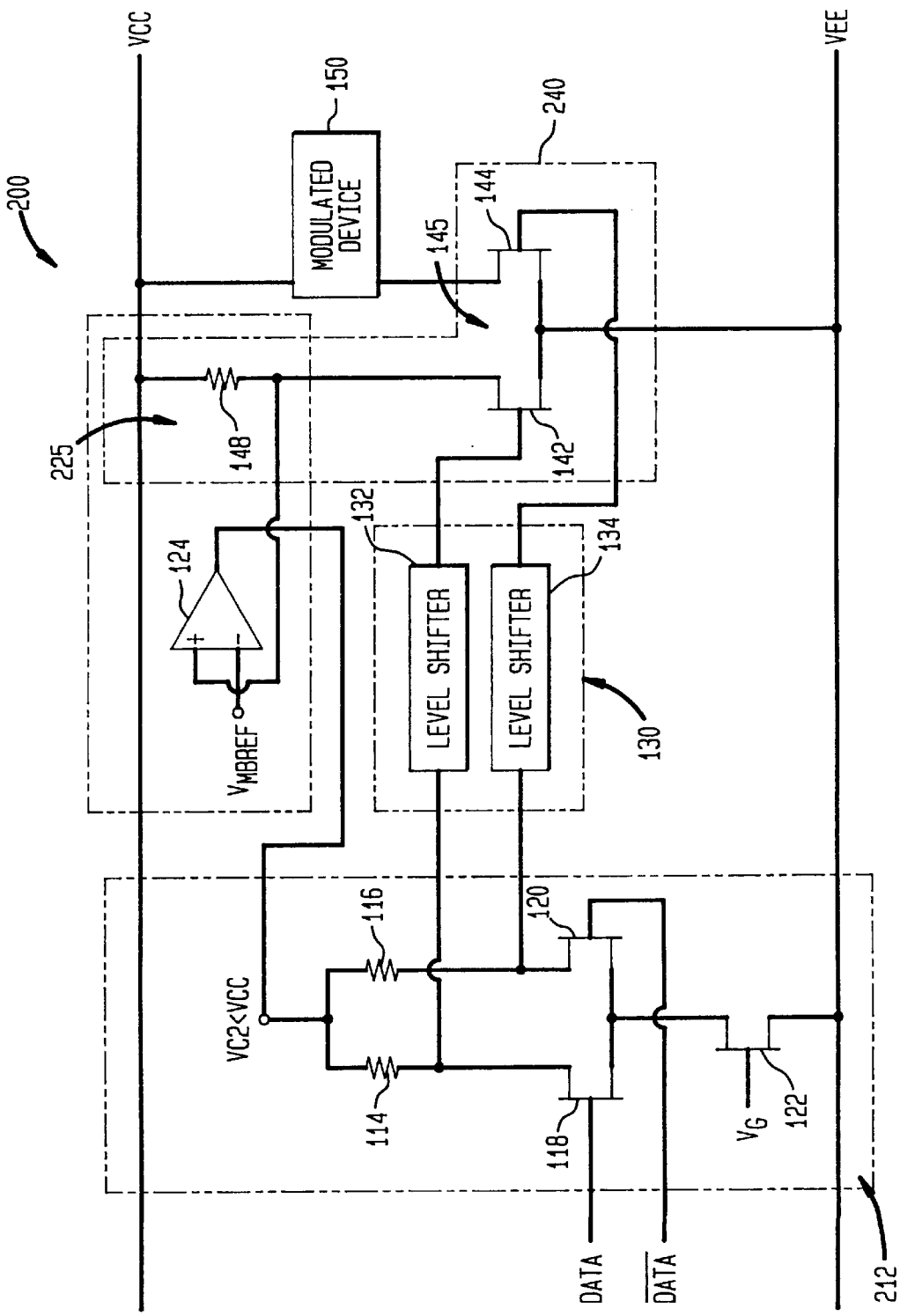
FIG. 3 is a circuit diagram of a driver circuit constructed in accordance with a second embodiment of the present invention.

FIG. 3 illustrates a driver circuit 200 constructed in accordance with a second embodiment of the present invention. It must be noted that elements in the circuit 200 that are the same as the elements used in the circuit 100 illustrated in FIG. 2 will have the same reference numerals. The driver circuit 200 is also used for driving a modulated device 150. In a preferred embodiment, the modulated device 150 is an EML or a laser with appropriate circuitry. The circuit 200 includes three stages, an input stage 212, level shifting stage 130 and an output stage 240. The level shifting and output stages 130, 240 are exactly the same as the first embodiment and do not require a further description.

The input stage 212, however, is modified such that an output amplitude control circuit 225 uses the third load resistor 148 as a current sensing resistor. This removes another circuit element, i.e., the current sensing resistor 126 (FIG. 2), from the driver circuit 200. In addition, as will be described below, a Mark-Bar reference voltage $V_{MBREF}$ is used to control the output voltage and current of the output stage 240.

The input stage 212 contains two load resistors 114, 116, first, second and third transistors 118, 120, 122, and an operational amplifier 124. The first transistor 118 has its gate terminal connected to the input data signal DATA while the second transistor 120 has its gate terminal connected to the complement of the input data signal $\overline{DATA}$. One input of the operational amplifier 124 is connected to a Mark-Bar reference voltage $V_{MBREF}$ which directly corresponds to the duty cycle of the input data signals DATA, $\overline{DATA}$. As is well known in the art, a Mark-Bar voltage is a DC voltage corresponding to the average duty cycle of the input data signals, DATA, $\overline{DATA}$. The second input of the operational amplifier 124 is connected between the third load resistor 148 and the output stage 240. The operational amplifier 124, third load resistor 148 and the Mark-Bar reference voltage $V_{MBREF}$ define an output amplitude control circuit 225 whose output is used as a control voltage $V_{C2}$ of the input stage 212. It must be noted that the value of the Mark-Bar reference voltage $V_{MBREF}$ is user defined and may be altered depending upon the particular application the driver circuit 200 is to be used in.

The first load resistor 114 is connected between the control voltage $V_{C2}$ and the drain terminal of the first transistor 118. The second load resistor 116 is connected between the control voltage $V_{C2}$ and the drain terminal of the second transistor 120. The second load resistor 116 is also connected to the first load resistor 114. The first and second transistors 118, 120 have their source terminals connected to the drain terminal of the third transistor 122. The third transistor 122 has its source terminal connected to a second potential $V_{EE}$ and its gate terminal connected to a gate voltage $V_G$ sufficient to activate the third transistor 122. The power supply voltage $V_{CC}$ is usually 0 volts while the second voltage $V_{EE}$ is usually –5 volts.

The input stage 212 is required to quantize the input signals DATA, $\overline{DATA}$. In addition, the output amplitude control circuit 225 of the input stage 212 is used to automatically control and maintain the output voltage and current of the output stage 240. This is achieved by creating and maintaining a constant voltage across the third load resistor 148 connected to the output stage 240. The voltage across the third load resistor 148 is equal to and controlled by the Mark-Bar reference voltage $V_{MBREF}$ applied to the operational amplifier 124. Since the Mark-Bar reference voltage $V_{MBREF}$ is adjustable, the voltage across the third load resistor 148 is also adjustable. Accordingly, the output voltage and current of the output stage 240 can be adjusted to meet the requirements of a specific application.

It must be noted that the present invention can be incorporated, for example, into a transmitter that is used to transmit data over an optical fiber transmission line as well as other applications requiring the control of a laser or EML.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A digital driver circuit comprising:
   an input stage for receiving and quantizing at least one applied input signal to produce at least one output signal, said input stage including a first control node for receiving an input stage signal which controls the quantization of said input stage;
   an output stage coupled to said input stage for generating a driver output signal in response to said at least one output signal, said output stage including a second node having a voltage representative of the driving current of said output stage and a current sensing device for sensing said driving current and generating the voltage of said second node; and
   a comparator having one input connected to receive the voltage at said second node and a second input for receiving a reference voltage, the output of said comparator being coupled to said first control node such that said first control node receives a signal representing the voltage of said second node as said input stage signal.

2. The driver circuit according to claim 1 wherein said comparator controls the voltage applied to said first control node to maintain a desired voltage level at said second node which corresponds to said reference voltage.

3. The driver circuit according to claim 1 further comprising a shifting stage coupled to said at least one output signal and said output stage, said shifting stage shifting down a voltage level of said at least one output signal.

4. The driver circuit according to claim 1 wherein a number of applied input signals is two, a number of output signals is two and said output stage generates said driver output signal in response to said two output signals.

5. The driver circuit according to claim 4 wherein said input stage comprises:
   a quantizing circuit connected to said applied input signals and said first control node, said quantizing circuit generating said output signals responsive to said applied input signals and said input stage signal.

6. The driver circuit according to claim 5 wherein said quantizing circuit comprises:
   first and second impedance elements, said first and second impedance elements being coupled to said input stage signal;
   a first transistor having its gate terminal connected to one applied input signal, its drain terminal connected to said first impedance element and it source terminal connected to a current source; and
   a second transistor having its gate terminal connected to receive a complement of said applied input signal, its drain terminal connected to said second impedance element and its source terminal connected to said current source and the source terminal of said first transistor, wherein said first and second transistors quantize said applied input signals to generate said output signals at their respective drains.

7. The driver circuit according to claim 6 wherein said current source is a third transistor having its drain terminal connected to the drain terminals of said first and second transistor, its gate terminal connected to a first voltage and its source terminal connected to a second voltage.

8. The driver circuit according to claim 4 wherein said output stage comprises:

an impedance element connected between a first voltage and said second node, said second node having a voltage representative of the driving current of said output stage responsive to an impedance of said impedance element;

a first transistor having its gate terminal connected to one output signal of said input stage, its drain terminal connected to a second voltage and its source terminal connected to said second node; and a second transistor having its gate terminal connected to the other output signal of said input stage, its drain terminal connected to a load and its source terminal connected to said second node and the source terminal of said first transistor, wherein said first and second transistors generate said driver output signal.

9. The circuit according to claim 8 wherein said impedance element is a resistor.

10. The circuit according to claim 8 wherein said input stage includes a DC reference voltage for generating said input stage signal.

11. A system for transmitting data over an optical fiber transmission line comprising:

an input stage for receiving and quantizing at least one applied input signal to produce at least one output signal, said input stage including a first control node for receiving an input stage signal which controls the quantization of said input stage;

an output stage coupled to said input stage for generating a driver output signal in response to said at least one output signal, said output stage including a second node having a voltage representative of the driving current of said output stage and a current sensing device for sensing said driving current and generating the voltage of said second node;

a comparator having one input connected to receive the voltage at said second node and a second input for receiving a reference voltage, the output of said comparator being coupled to said first control node such that said first control node receives a signal representing the voltage of said second node as said input stage signal; and a device which has its output modulated by said driver output signal.

12. The system according to claim 11 wherein said device is a laser.

13. The system according to claim 11 wherein said device is an electroabsorption modulated laser device.

14. The system according to claim 11 wherein said comparator controls the voltage applied to said first node to maintain a desired voltage level at said second node which corresponds to said reference voltage.

15. The system according to claim 11 further comprising a shifting stage coupled to said at least one output signal and said output stage, said shifting stage shifting down a voltage level of said at least one output signal.

16. The system according to claim 11 wherein a number of applied input signals is two, a number of output signals is two and said output stage generates said driver output signal in response to said two output signals.

17. The system according to claim 16 wherein said input stage comprises:

an operational amplifier, said operational amplifier having an input connected to a reference voltage and an input connected to said second node of said output stage, said operational amplifier generating said input stage signal; and an quantizing circuit connected to said applied input signals and said first control node, said quantizing circuit generating said output signals responsive to said applied input signals and said input stage signal.

18. The system according to claim 17 wherein said quantizing circuit comprises:

first and second impedance elements, said first and second impedance elements being coupled to said input stage signal;

a first transistor having its gate terminal connected to one applied input signal, its drain terminal connected to said first impedance element and its source terminal connected to a current source; and a second transistor having its gate terminal connected to receive a complement of said applied input signal, its drain terminal connected to said second impedance element and its source terminal connected to said current source and the source terminal of said first transistor, wherein said first and second transistors quantize said applied input signals to generate said output signals at their respective drains.

19. The system according to 18 wherein said current source is a third transistor having its drain terminal connected to the drain terminals of said first and second transistor, its gate terminal connected to a first voltage and its source terminal connected to a second voltage.

20. The system according to claim 16 wherein said output stage comprises:

an impedance element connected between a first voltage and said second node, said second node having a voltage representative of the driving current of said output stage responsive to an impedance of said impedance element;

a first transistor having its gate terminal connected to one output signal of said input stage, its drain terminal connected to a second voltage and its source terminal connected to said second node; and a second transistor having its gate terminal connected to the other output signal of said input stage, its drain terminal connected to a load and its source terminal connected to said second node and the source terminal of said first transistor, wherein said first and second transistors generate said driver output signal.

21. The system according to claim 20 wherein said impedance element is a resistor.

22. The system according to claim 20 wherein said input stage includes a DC reference voltage for generating said input stage signal.

23. A method of controlling a modulated device comprising:

providing a modulated device responsive to a driver signal for generating a modulated output, the modulated output having an output amplitude;

inputting data to be output by said modulated device as the modulated output;

sensing a current of an output circuit used to generate said driver signal;

comparing a reference voltage to voltage indicative of said sensed current to determine an amount of control voltage required;

generating a control voltage on said determined amount of control voltage required;

applying said control voltage to said output circuit; and generating said driver signal with said output circuit to drive said modulated device to produce the modulated output with a desired output amplitude in response to said control voltage.

24. The method according to claim 23 wherein a DC reference voltage is used to generate said control voltage.

25. The method according to claim 23 wherein said DC reference voltage is applied across an impedance element connected to said output circuit.

26. The method according to claim 23 wherein the reference voltage corresponding to a value of said data signals is used to generate said control voltage.

27. The method according to claim 26 wherein said reference voltage is applied across an impedance element connected to an output of said output circuit.

28. A digital driver circuit comprising:

an input stage for receiving and quantizing at least one applied input signal to produce at least one output signal, said input stage including a first control node for receiving an input stage signal which controls the quantization of said input stage;

an output stage coupled to said input stage for generating a driver output signal in response to said at least one output signal, said output stage including a second node having a voltage representative of the driving current of said output stage; and a comparator having one input connected to receive the voltage at said second node and a second input for receiving a reference voltage, the output of said comparator being coupled to said first control node such that said first control node receives a signal representing the voltage of said second node.

29. A system for transmitting data over an optical fiber transmission line comprising:

an input stage for receiving and quantizing at least one applied input signal to produce at least one output signal, said input stage including a first control node for receiving an input stage signal which controls the quantization of said input stage;

an output stage coupled to said input stage for generating a driver output signal in response to said at least one output signal, said output stage including a second node having a voltage representative of the driving current of said output stage;

a comparator having one input connected to receive the voltage at said second node and a second input for receiving a reference voltage, the output of said comparator being coupled to said first control node such that said first control node receives a signal representing the voltage of said second node; and a device which has its output modulated by said driver output signal.

30. A digital driver circuit comprising:

an input stage for receiving and quantizing two applied input signals to produce two output signals, said input stage including a first control node for receiving an input stage signal which controls the quantization of said input stage; and an output stage coupled to said input stage for generating a driver output signal in response to said output signals, said output stage including a second node having a voltage representative of the driving current of said output stage and a current sensing device for sensing said driving current and generating the voltage of said second node, said first control node receiving a signal representing the voltage of said second node, wherein said input stage comprises:

an operational amplifier, said operational amplifier having an input connected to a reference voltage and an input connected to said second node of said output stage, said operational amplifier generating said input stage signal, and a quantizing circuit connected to said applied input signals and said first node, said quantizing circuit generating said output signals responsive to said applied input signals and said input stage signal.

31. A digital driver circuit comprising:

an input stage for receiving and quantizing two applied input signals to produce two output signals, said input stage including a first control node for receiving an input stage signal which controls the quantization of said input stage; and an output stage coupled to said input stage for generating a driver output signal in response to said output signals, said output stage including a second node having a voltage representative of the driving current of said output stage and a current sensing device for sensing said driving current and generating the voltage of said second node, said first control node receiving a signal representing the voltage of said second node, wherein said output stage comprises:

an impedance element connected between a first voltage and said second node, said second node having a voltage representative of the driving current of said output stage responsive to an impedance of said impedance element, a first transistor having its gate terminal connected to one output signal of said input stage, its drain terminal connected to a second voltage and its source terminal connected to said second node, and a second transistor having its gate terminal connected to the other output signal of said input stage, its drain terminal connected to a load and its source terminal connected to said second node and the source terminal of said first transistor, wherein said first and second transistors generate said driver output signal.

* * * * *